(12) United States Patent
Vatelmacher

(10) Patent No.: US 11,437,536 B2
(45) Date of Patent: Sep. 6, 2022

(54) SOLAR ARRAY MODULE SYSTEM FOR GENERATING ELECTRIC POWER

(71) Applicant: SOLARWAT LTD, Even Yehuda (IL)

(72) Inventor: Boris Vatelmacher, Ganei Tikva (IL)

(73) Assignee: SOLARWAT LTD., Even Yehuda (IL)

( * ) Notice: Subject to any disclaimer, the term of this patent is extended or adjusted under 35 U.S.C. 154(b) by 71 days.

(21) Appl. No.: 15/764,248

(22) PCT Filed: Sep. 20, 2016

(86) PCT No.: PCT/IL2016/051038
§ 371 (c)(1),
(2) Date: Mar. 28, 2018

(87) PCT Pub. No.: WO2017/060896
PCT Pub. Date: Apr. 13, 2017

(65) Prior Publication Data
US 2019/0058071 A1 Feb. 21, 2019

(30) Foreign Application Priority Data

Oct. 6, 2015 (IL) .......................................... 241909

(51) Int. Cl.
*H02S 40/36* (2014.01)
*H01L 31/05* (2014.01)
(Continued)

(52) U.S. Cl.
CPC ........ *H01L 31/0504* (2013.01); *H01L 31/042* (2013.01); *H02S 40/30* (2014.12);
(Continued)

(58) Field of Classification Search
CPC .............................. H01L 31/0504; H02S 40/34
(Continued)

(56) References Cited

U.S. PATENT DOCUMENTS 6,265,242 B1 7/2001 Komori et al.
6,469,241 B1 * 10/2002 Penn ....................... F24S 23/31
136/246

(Continued)

FOREIGN PATENT DOCUMENTS

DE 102013100893 A1 7/2014
WO 2011089607 A1 7/2011
(Continued)

OTHER PUBLICATIONS

International Search Report; PCT Application No. PCT/IL2016/051038; dated Apr. 13, 2017.
(Continued)

*Primary Examiner* — Dustin Q Dam
(74) *Attorney, Agent, or Firm* — Polsinelli PC

(57) ABSTRACT

An improved solar power generation system, having at least one solar-array module. The solar cells in a solar-array module are interconnected in a crisscross matrix network configuration. The solar cells are a pre-sorted by the class of tolerance level of output power, such that the solar cells in each of the rows of solar cells are arranged in a steadily ascending (or steadily descending) order of the maximum power values that the solar cells are capable to provide, wherein the maximum power value of a solar cell in a particular row is higher or equal to the maximum power values of the previous (next, for steadily descending order) solar cells in the same row.

10 Claims, 5 Drawing Sheets

(51) Int. Cl.
*H01L 31/042* (2014.01)
*H02S 40/30* (2014.01)
*H02S 50/00* (2014.01)

(52) U.S. Cl.
CPC .............. *H02S 40/36* (2014.12); *H02S 50/00* (2013.01); *Y02E 10/50* (2013.01)

(58) Field of Classification Search
USPC ................................................ 136/243–265
See application file for complete search history.

(56) References Cited

U.S. PATENT DOCUMENTS

| | | | |
|---|---|---|---|
| 2008/0121264 A1* | 5/2008 | Chen | H01L 31/046 136/244 |
| 2008/0210286 A1 | 9/2008 | Ball | |
| 2008/0216886 A1* | 9/2008 | Iwakura | H01L 31/046 136/244 |
| 2014/0360561 A1* | 12/2014 | Meyer | F24S 23/77 136/251 |

FOREIGN PATENT DOCUMENTS

| | | |
|---|---|---|
| WO | 2012006723 A1 | 1/2012 |
| WO | 2013144963 A1 | 10/2013 |
| WO | 2017060896 A1 | 4/2017 |

OTHER PUBLICATIONS

Written Opinion of PCT Application No. PCT/IL2016/051038; dated Apr. 13, 2017.

English Description of DE102013100893; Retreived From www.espacenet.com on Mar. 20, 2018.

European Search Report; EP Application No. 16853196.0; dated May 2, 2019.

Yu, Byunggyu, "Analysis and Experiment of Cross-Tied Configuration of Partial Shaded PV Array"; Retrieved from EU PVSEC Proceedings on Sep. 24, 2019.

* cited by examiner

SOLAR ARRAY MODULE SYSTEM FOR GENERATING ELECTRIC POWER

CROSS-REFERENCE TO RELATED APPLICATIONS

This application is a national stage entry of PCT/IL2016/051038 filed Sep. 20, 2016, which claims convention priority from Israeli patent application 241909 filed on Oct. 6, 2015, the contents each of which are hereby incorporated by reference in their entirety.

FIELD OF THE INVENTION

The present invention relates to a solar array module system for generating electric-power and more particularly, to an improved solar array module system, solar-array, having a crisscross network configuration, adapted to maximize the power generation from a solar module, arranged in columns of steadily ascending (or steadily descending) maximum power values.

BACKGROUND OF THE INVENTION

Solar photovoltaic cells are widely used in a variety of applications to generate electricity. Typically, a single solar cell produces an output voltage around 0.5V, and a plurality of cells, typically Silicon based, is conventionally connected in series to provide higher voltage levels. Referring to FIG. 1, multiple solar cell 22 are conventionally connected in series to form a "serial-unit" 26 of solar cells 22, wherein multiple serial-units 26 may be interconnected in series to form a string of serial-units 28, in order to obtain the desired output voltage in a solar-array module 20. Each serial-unit 26 may include one or more photovoltaic cells, connected in parallel with a bypass-diode 25, which bypass-diode 25 is added to bypass the serial-units that malfunction as a result of local problems such as dirt, overcasting shadows, other partial shading or otherwise malfunctioning cells.

The number of solar cells, being connected in an array, is designed to provide a predesigned target power level, for example 150 W, 200 W, 300 W, etc. However, each solar/photovoltaic cell has a tolerance that typically, with no limitations, ranges from 1%-7.5%, and has an impact on the total output power level of the solar array. The tolerances may vary from one manufacture to another. For example only, QCELL manufactures 11 classes of photovoltaic cells for solar arrays ranging from about 245 W to 265 W, wherein each class represents a different tolerance level of output power. The maximum power of each 4 W solar cell may range from 3.75 W to 4.25 W, which translates to a difference of over 13%. Class 1 are solar cells with a maximum output power level of 4 W-0.5 W; class 2 are solar cells with a maximum output power level of 4 W-0.2 W; class 3 are solar cells with a maximum output power level of 4 W-0.15 W; class 6 are solar cells with a maximum output power level of 4 W-0 W; and so on and so forth until class 11 being solar cells with a maximum output power level of 4 W+0.25 W. All numbers are given by way of example only, with no limitations, and may vary in values and annotation schemes.

It should be noted that tolerances may be even larger than 13%. Since the solar cells in QCELL's solar panels are arranged in series, as illustrated in FIG. 1, the total output power is determined by the solar cell having the lowest maximum output power, thereby losing the excess power provided by the other cells. For example, cells 22 in panel 20 provide the following maximum output powers: 3.9 W, 4.25 W, 3.75 W, 4.1 W and 4.2 W. Hence the panel provides 3.75×5=18.75 W, which means a loss of: (3.9+4.25+3.75+4.1+4.2)−18.75=1.45 W, which is 7.2% of the total output of all the individual solar cells.

A solar-array, having a crisscross (matrix) network configuration, is typically embodied in a single solar module, wherein each solar-array module includes a multiplicity of solar cells. The "crisscross" implementation relates to a previously described invention by the same inventor in PCT applications No.: WO/2011/089607, filed on Jan. 23, 2011, and PCT/IL2013/050291, filed on Mar. 30, 2013, by the same inventor as the instant application and which are owned in common, which are hereby incorporated by reference in their entirety.

The "crisscross" implementation is an electrical wiring configuration which enables obtaining higher output power, since it enables bypassing cells providing lower power, as described in PCT published applications No.: WO/2011/089607. FIG. 2 is a schematic illustration showing an example of a solar-array module 100 having crisscross network of solar cells 110, illustrating the cell bypassing ability. In this example, each solar cell is designed under light conditions, to provide 4 W±3%. Cell 4d provides 4 W−3% and solar cell 4e provides 4 W+3%, under the same light conditions. Hence, the current produced by solar cell 4e is higher than the current produced by solar cell 4d. As a result of the crisscross configuration, some of the excess current will flow via solar cell 3d and/or 5d and therefore, the output power of the solar module and the solar panel will be higher.

There is therefore a need and it would be advantageous to have a solar cell configuration that facilitates obtaining higher output power than the output power the solar cell having the lowest output power times the number of cells.

SUMMARY OF THE INVENTION

The "crisscross" implementation is an electrical matrix wiring configuration which enables obtaining higher output power, since it enables bypassing cells providing lower power, as described in PCT published applications No.: WO/2011/089607. Therefore, solar arrays, having a crisscross configuration, may be configured to provide an output power which is proximally the sum of the outputs of all the individual solar cells in the array.

By way of introduction, the principal intentions of the present invention include providing configurations of interconnectivity between solar cells, in a solar-array module having a crisscross network configuration, wherein such configuration facilitates maximization of the power generated by a solar-array module and not delimit by the power produced by the solar cell having the lowest output power, in each serial string of cells.

According to the teachings of the present invention there is provided a configuration of interconnectivity between solar cells, in a solar-array module having a crisscross matrix network configuration, wherein adjacently to a solar cell, having a particular lower maximum power level, there is connected, on the same row of cells, at least one solar cell with a higher or equal maximum power level, provided that such higher power level exists in the solar module.

An aspect of the present invention is to provide an improved solar power generation system for generating electrical power for a desired application, the system including at least one solar-array module. The at least one solar array module includes a multiplicity of solar cells, physically arranged in a crisscross, N by M matrix configuration.

A preconfigured number (M) of the solar cells are electrically connected in series to form a string of serial-units, being column of solar cells, the string of serial-units is facilitated to produce a first output voltage level; and a preconfigured number (N) of the strings of serial-units are electrically connected in parallel, forming rows of solar cells, to form the N by M, crisscross matrix configuration, being an array of the solar cells, and wherein the array of the solar cells is facilitated to produce a first output power level. The solar cells are a pre-sorted by the class of tolerance level of output power, wherein the solar cells in each of the rows of solar cells are arranged in either:

i. a steadily ascending order of the maximum power values that the solar cells are capable to provide, wherein the maximum power value of a solar cell in a particular row is higher or equal to the maximum power values of the previous solar cells in the same row; or ii. a steadily descending order of the maximum power values that the solar cells are capable to provide, wherein the maximum power value of a solar cell, in a particular row, is higher or equal to the maximum power values of the next solar cells in the same row.

The at least one solar array module includes a at least one high efficiency DC/DC power transformer or at least one high efficiency DC/DC converter electricity connected to the crisscross matrix array of solar cells, the DC/DC power transformer or DC/DC converter configured to boost the first output voltage level to a second output voltage level, higher than the first output voltage level, wherein the first output voltage level is insufficient to meet the desired application operating voltage level requirement.

Optionally, the solar cells, in each of the string of serial-units, are of the same class of tolerance level of output power.

Optionally, the solar cells in last column of solar cells, having the highest maximum power values, are all of the same class of tolerance level of output power.

Preferably, the first output power level is equal or higher than the operating power for the desired application.

It should be noted that throughout the present disclosure, the invention is described using the text and related drawings. The equations are included only as a possible help to persons skilled in the art, and should not be considered as limiting the invention in any way. Various other equations may be used by persons skilled in the art.

BRIEF DESCRIPTION OF THE DRAWINGS

The present invention will become fully understood from the detailed description given herein below and the accompanying drawings, which are given by way of illustration and example only, and thus not limiting in any way, wherein:

FIG. 3 is a schematic block diagram showing an example solar-array module, wherein the columns of solar cells are arranged in ascending class order, with respect to the maximum power generated by each columns, according to embodiments of the present invention.

FIG. 4 is a schematic block diagram showing another example of a solar-array module, wherein the columns of solar cells are arranged in ascending class order, with respect to the maximum power generated by each columns, according to embodiments of the present invention.

DETAILED DESCRIPTION OF THE INVENTION

Figure 1:
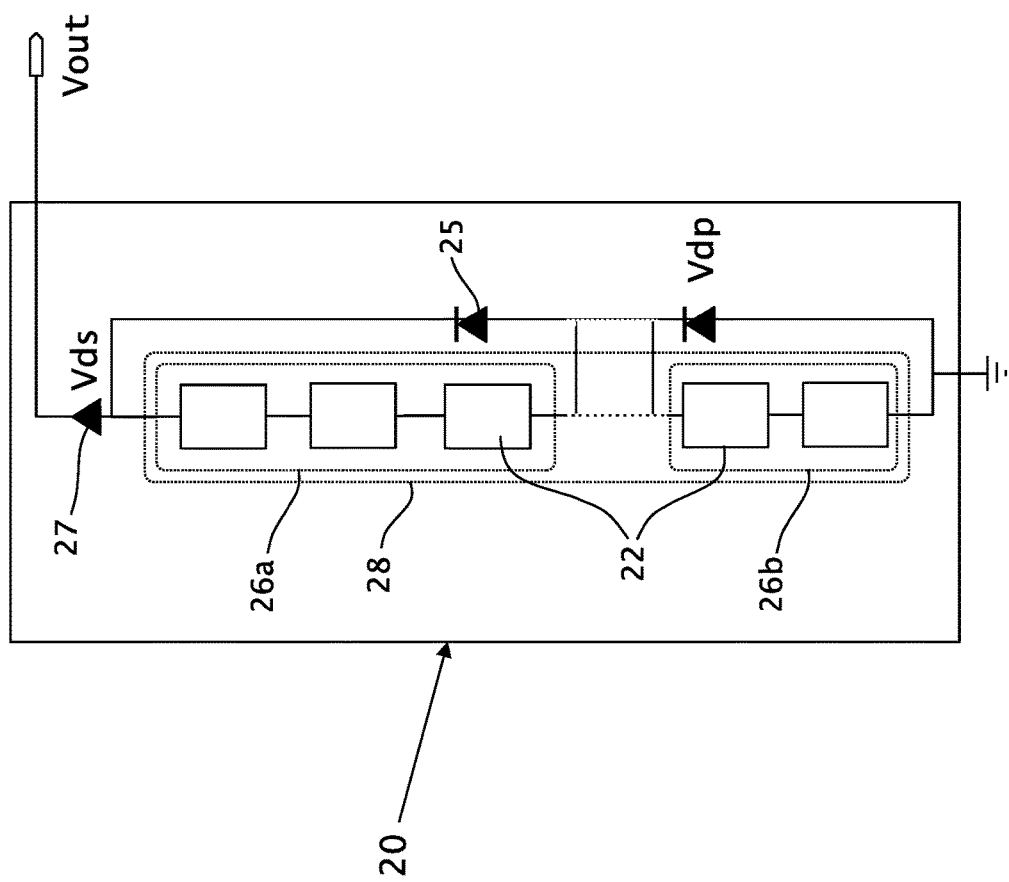
FIG. 1 (prior art) is a schematic block diagram showing a conventional solar module with multiple cells electrically connected in series to form serial-units, wherein each serial-unit is bypassed by a diode, parallel connected, wherein the serial-units may be interconnected in series to form a string of serial-units, and wherein each module is protected by a series diode.
Figure 2:
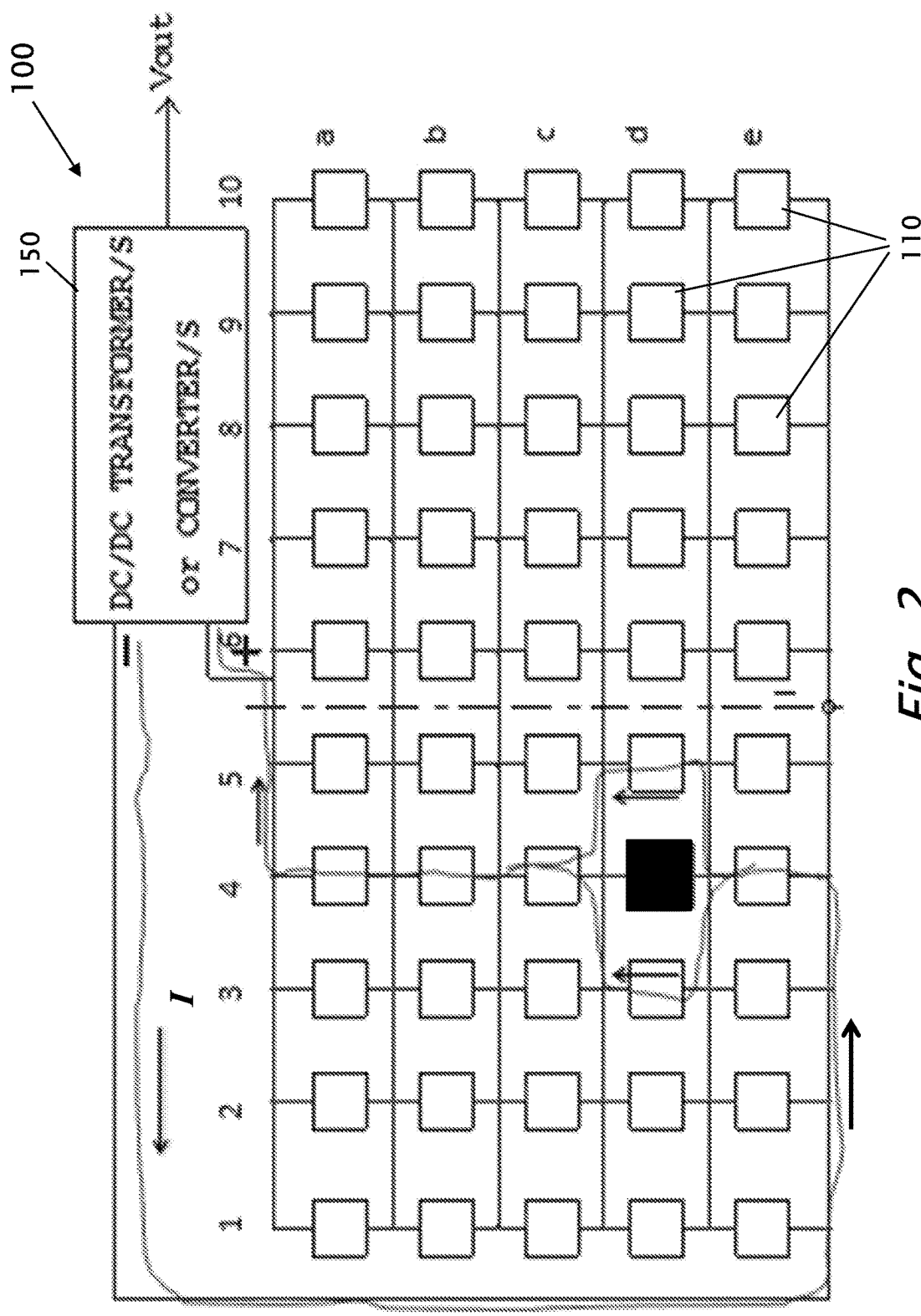
FIG. 2 (prior art) is a schematic illustration showing an example of a solar-array module, including crisscross network of solar cells, illustrating a cell bypassing ability.

The present invention now will be described more fully hereinafter with reference to the accompanying drawings, in which preferred embodiments of the invention are shown. It should be noted that the various types of electrical connections, converters, transformers, solar cells and so forth may optionally be based upon the teachings of previously described PCT applications No.: WO/2011/089607 and PCT/IL2013/050291, to the extent necessary for a complete, enabling disclosure. This invention may, however, be embodied in many different forms and should not be construed as limited to the embodiments set forth herein; rather, these embodiments are provided, so that this disclosure will be thorough and complete, and will fully convey the scope of the present invention to those skilled in the art.

An embodiment is an example or implementation of the inventions. The various appearances of "one embodiment," "an embodiment" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment.

Reference in the specification to "one embodiment", "an embodiment", "some embodiments" or "other embodiments" means that a particular feature, structure, or characteristic described in connection with the embodiments is included in at least one embodiments, but not necessarily all embodiments, of the inventions. It is understood that the phraseology and terminology employed herein is not to be construed as limiting and are for descriptive purpose only.

Methods of the present invention may be implemented by performing or completing manually, automatically, or a combination thereof, selected steps or tasks. The term "method" refers to manners, means, techniques and procedures for accomplishing a given task including, but not limited to, those manners, means, techniques and procedures either known to, or readily developed from known manners, means, techniques and procedures by practitioners of the art to which the invention belongs. The descriptions, examples, methods and materials presented in the claims and the specification are not to be construed as limiting but rather as illustrative only.

Unless otherwise defined, all technical and scientific terms used herein have the same meaning as commonly understood by one of ordinary skill in the art to which the present invention belongs. The methods and examples provided herein are illustrative only, and not intended to be limiting.

According to the teachings of the present invention there is provided a configuration of interconnectivity between solar cells, in a solar-array module having a crisscross matrix network configuration, wherein such configuration facilitates maximization of the power generated by a solar-array module and not delimit by the maximum power produced by the solar cell having the lowest maximum output power, in each serial string of cells. The configuration method facilitates obtaining a maximal output power from the solar module, which power is proximally the sum of the maximum output of all the individual solar cells in the array.

The principle of the configuration methods is to ensure that adjacently to a cell, having a particular lower maximum power level, there is connected, on the same row, at least one solar cell with a higher or equal maximum power level, provided that such higher power level exists in the solar module.

Figures 3, 4:
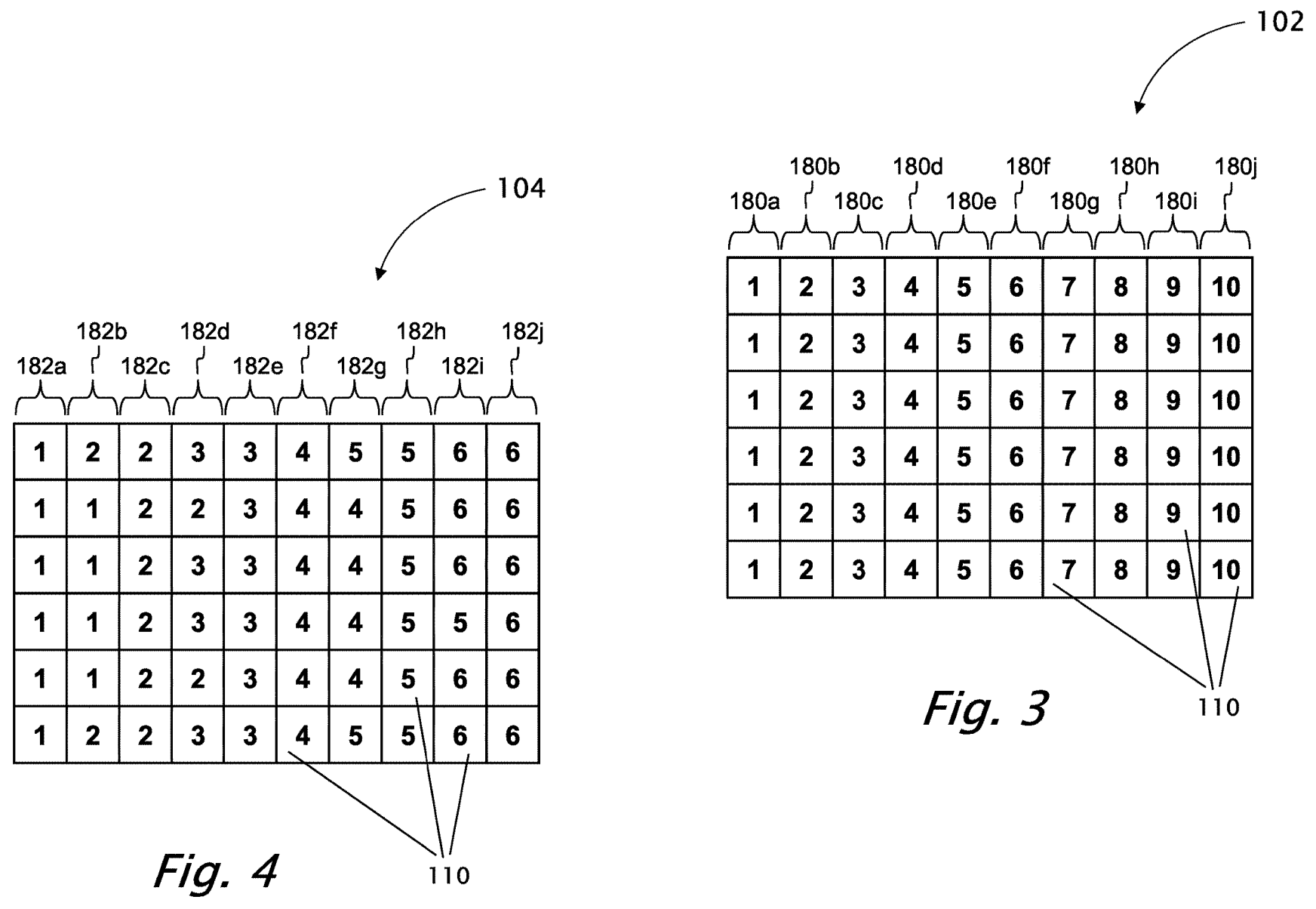

In one embodiment of the present invention, the solar cells are arranged in the array module (102), in continuous, steadily ascending (or steadily descending) order in maximum power levels. Following the QCELL example, let's say that a solar array module includes 10 columns and 6 rows of solar cells 110, arranged in a crisscross matrix configuration, as shown in FIG. 3. 10 classes of solar cells are used, 6 of each class.

The 6 solar cells of the class with the worst tolerance (class 1), are used to compose the left most column of solar cells 110 that are electrically connected in series to form serial-unit 180a. The next column of solar cells 110 to the right, forming serial-unit 180b, is composed of solar cells of class 2, the next column of solar cells 110 to the right, forming serial-unit 180c, is composed of solar cells of class 3, and so on and so forth until the array is complete with column 10, forming serial-unit 180j, having solar cells 110 of class 10. Such configuration ensures that the adjacent cell to the right, for each solar cell of classes 1-9, is of a higher maximum power level. In such a case, the current generated by solar cell situated at a lower order column of cells 110, can fully flow towards the load, as all solar cells in each column of cells are of the same class. It should be noted each solar cell maintains its ability to provide electric current to thereby facilitate the generation of the maximum power the solar cells are actually capable to provide.

In one embodiment of the present invention (for example only), the solar cells are generally arranged in the array module (104), in a steadily ascending (or steadily descending) order in maximum power levels, along each row of solar cells. Following again the QCELL example, let's say that a solar array module includes 10 columns and 6 rows of solar cells 110, arranged in a crisscross matrix configuration, as shown in FIG. 4. 6 classes of solar cells are using 10 solar cells of each class.

The solar cells are arranged such that the 6 solar cells belonging to the class having the worst tolerance (class 1), are used to compose the left most column of solar cells 110 (with reference to FIG. 4) that are electrically connected in series to form serial-unit 182a of solar cells 110. The next column of solar cells 110 to the right, forming serial-unit 182b, is composed of a mixture of solar cells of class 1 and class 2, the next column of solar cells 110 to the right, forming serial-unit 182c, is composed of solar cells of class 2, the next serial-unit (182d) to the right is composed of mix of solar cells of class 2 and class 3, the next serial-unit (182e) to the right is composed of solar cells of class 3, and so on and so forth until the array is complete with column 10, forming serial-unit 182j, having solar cells of class 6. Such configuration ensures that the adjacent cell 110 to the right for each solar cell 110 of classes 1-6, is of a higher or equal maximum power level. In such arrangement, when the cell above a particular solar cell 110 is of lower class, the cell on the right of that lower class solar cell is of a class having a higher or equal maximum power level. As for column 10, in the example shown in FIG. 4, if all cells 110 are of the same (high) class there is no problem. But if the cells are of various classes, the cells 110 are arranged in either a steadily ascending class order from the left side of each row to the right side of each row, or a steadily descending class order from the left side of each row to the right side of each row. In other words, when the cell above a particular solar cell generates less current than the particular solar cell, the particular solar cell channels the excess current through a neighboring cell to the right (in another column) in a steadily ascending class order (or to the left in steadily descending class order, not shown), which neighboring cell has a higher current solar cell that is of higher class.

In the example arrangement 102 and 104, as shown in FIGS. 3 and 4 respectively, in right most part of the panel (102 and 104), the higher power cells are disposed, that also create voltage level that is a bit higher than the voltage level created in the left most part of the panel. For example, with reference to FIG. 3, in QCELL panels of type Q.PEAK, having low level wattage of 245 W, the low level class cells generate a voltage at Vmpp of 0.495V, while the high level class cells generate a voltage of 0.515V. Since all solar cells are arranged in a crisscross networking configuration, all cells 110 having the same class classification are connected in the same column, and the cells to the right of them are of higher or equal class.

For the sake of clarity, it should be noted that the configurations shown in FIGS. 3 and 4 are given by way of example only and a wide variety may be used, maintain the steadily ascending (or steadily descending) class order arrangement of the solar cells columns.

Figure 5:
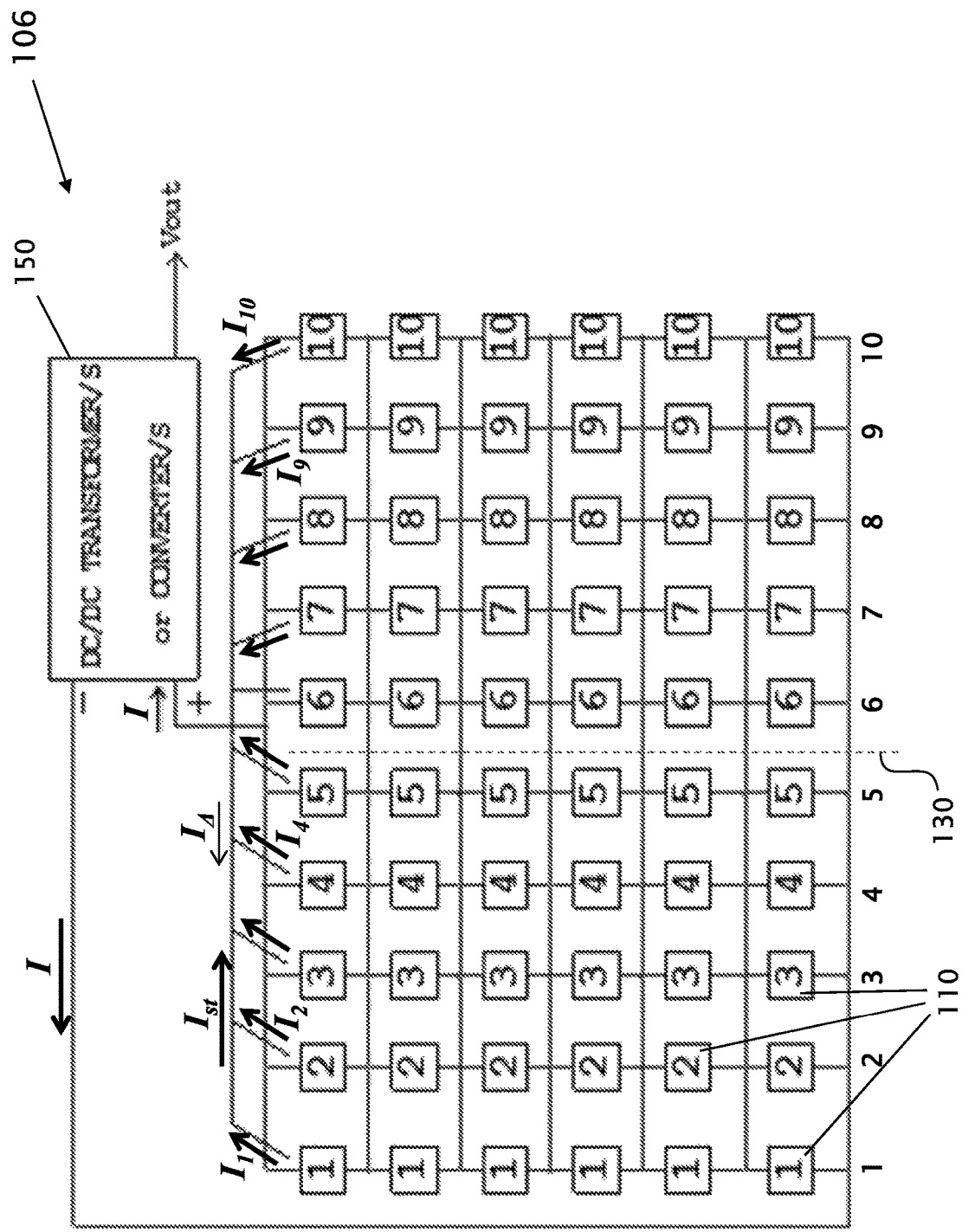
FIG. 5 is a schematic block diagram showing an example solar-array module, illustrating the voltage balancing process.
Figure 6:
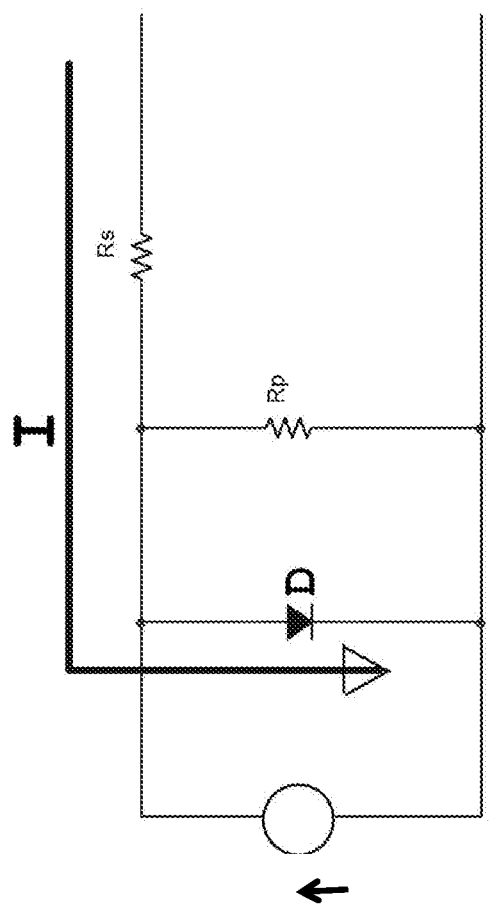
FIG. 6 schematically illustrates an equivalent circuit of a solar cell.

Reference is also made to FIG. 5, a schematic block diagram showing an example solar-array module 106, illustrating the voltage balancing process. Once light illuminates a solar cell 110, begin to generate electric current, flowing throughout DC/DC transformer or converter 150 towards the load (not shown). Column 1 generates electrical current $I_1$, column 2 generates electrical current $I_2$, column 3 generates electrical current $I_3$, column 4 generates electrical current $I_4$, and so on and so forth. However, the average voltage of each column to the right of the virtual centerline 130 is a bit higher than the voltage generated by these left columns. Since the voltage created over columns with higher power, such as column 10, is a bit higher than the voltage created over columns with lower power, such as column 1, connected to the left (in the drawing) of the respective columns with higher power, current difference $I_A$ is also flowing towards solar cells 110 situated to the left of the columns with lower power. Current $I_A$ flows throughout solar cells inner diode "D" of an equivalent circuit (see FIG. 6 schematically illustrating an equivalent circuit of solar cell 110). The difference in voltage, in the examples shown, with no limitations, is typically 0-2%. This process, in which current $I_A$ flows throughout solar cells inner diode "D" of lower class columns, continues until an equal and average voltage is created over all columns of solar cells 110.

As a result of the voltage balancing process of all 10 columns (in this example, with no limitations), the yielded average voltage is higher than the initial voltage over column 1-4. Each solar cells column continues to generate the electrical current that it is capable to produce. The yielded wattage is higher not only because a higher average voltage than the voltage of the classes 1-4 columns, but more so because stronger currents in the classes higher than in the class 1 column. This is because the changes in the voltage levels are smaller than the changes in the current, in the generated by the different class columns.

For example, in the panel using the cell arrangement shown in FIG. 4, the voltage of the class-1 column is different from the voltage of the class-6 column by 1.6%— as a result of the voltage balancing process the voltage changes of 0.8%. The current in a class-1 column is different from the current in a class-6 column by 3.8%. In the case of the current generated by each column, these currents are summed up, wherein the current produced by the columns to the right of the class-1 column, is higher than the current produced by the class-1 column.

It should be noted that in the prior art serially connected solar cells, the cell generating the lower current sets the current generated by the whole column.

It should be further noted that the calculations herein on, are given by way of example only, and are approximated to demonstrate the power gain obtained by the orderly arrangement of solar cells 110, interconnected in a crisscross matrix configuration.

Example

Given a solar-array module having fifty solar cells, each designed to provide 4 W, 10 columns and 5 rows, arrange in 10 classes (similar to solar-array module 106 shown in FIG. 5, except for having 5 rows rather than 6).

The yielded wattage is as follows:

| Power class | 1 | 2 | 3 | 4 | 5 | 6 | 7 | 8 | 9 | 10 |
|---|---|---|---|---|---|---|---|---|---|---|
| One cell nominal power (W) | 3.75 | 3.8 | 3.85 | 3.89 | 3.94 | 3.99 | 4.04 | 4.094 | 4.14 | 4.19 |
| Fife cell (cells string) nominal power (W) | 18.75 | 19.0 | 19.25 | 19.45 | 19.7 | 19.95 | 20.2 | 20.47 | 20.7 | 20.95 |
| String average power | | | | | 19.84 W | | | | | |
| 50 cells panel expected power | | | | | Pmatrix = 198.4 W | | | | | |

In contrast, in a regular solar panel, in which panel the solar cells are serially interconnected and cell with the lower current (wattage) dictates the level of the output power of the whole string of solar cells, the expected wattage is as follows:

$P\text{series} = 3.75\ W * 50 = 187.5\ W.$

That is, in this example, the crisscross solar array module, configured according to the present invention, the yielded wattage is higher by about 8.2%. Practically, the difference is somewhat lower, but higher than 4.1%, as some of the power is consumed by the voltages averaging process.

Similar power gains also apply when comparing, for example, with no limitations, to 60 solar cells 110, arranged in 10 columns and interconnected in a crisscross matrix configuration, but in a random order. Here too, in each serial-unit, the solar cell having the lowest class determines the current generated from the respective serial-unit.

Let us assume, for simplicity and by way of example only, that each serial-unit contains a solar cell of the lowest class. Also, the ability of the solar-array module, being in a crisscross matrix configuration, is ignored. Then we can write:

$P = (I\text{column1} * V\text{column1}) + \ldots (I\text{column10} * V\text{column10}).$ Since all columns of solar cells 110 are also connected in parallel, then the voltage V balances out, as described here above, and therefore, an average voltage Uaverage is created over all columns of solar cells 110.

Then we can write:

$P = U\text{average} * (I1 + I2 + \ldots I10)$

For an ordinary, crisscross matrix configuration, if each serial-unit contains a solar cell of the lowest class, the current in each column of solar cells 110 is I1. We can therefore write:

$P = U\text{average} * I1 * 10$

However, in a crisscross matrix configuration, being in a steadily ascending (or steadily descending) class order, then according to the example shown in FIG. 3 there are 6 cells of 10 classes arranged in 10 columns, according to the present invention, and we can write:

$P = U\text{average} * (I1 + I2 + \ldots I10).$

Since each current from I2 to I10 is bigger of I1, we can write:

$P = U\text{average} * (I1 + I1 * K2 + \ldots I1 * K10),$ or $P = U\text{average} * I1 * (1 + 1 * K2 + \ldots 1 * K10),$ where K2-K10 are all bigger than "one" and in ascending order. For example: K2=1.012, ... K10=1.036.

$P = U\text{average} * I1 * (>10)$

In order to prove that the crisscross connections of cells arranged in a steadily ascending (or steadily descending) class order of the columns output power is bigger of regular crisscross connections, we divide the expression of the crisscross in a steadily ascending (or steadily descending) class order connection by the expression of regular crisscross connections output power:

$$\frac{P = U\text{average} * I1 * (>10)}{P = U\text{average} * I1 * 10},$$

that is, the ratio is >1.

Thereby, the whole solar module with crisscross matrix connections, but arranged in a steadily ascending (or steadily descending) class order of the columns of solar cells (see FIGS. 3, 4, for example), yields a higher wattage than a regular solar module with the regular crisscross matrix connections, in which module the solar cells are not arranged in a steadily ascending (or steadily descending) class order of the columns of solar cells.

The present invention being thus described in terms of several embodiments and examples, it will be appreciated that the same may be varied in many ways. Such variations are not to be regarded as a departure from the spirit and scope of the invention, and all such modifications as would be obvious to one skilled in the art are contemplated.

What is claimed is:

1. A solar power generation system for generating electrical power for a desired application operating voltage level requirement, the system comprising at least one solar-array module, wherein said at least one solar-array module comprises:
- a multiplicity of solar cells, physically arranged in a crisscross, N by M matrix configuration,
- wherein a preconfigured number (M) of said multiplicity of solar cells are electrically connected in series to form strings of serial-units, being columns of columnar solar cells, said string of serial-units is facilitated to produce a first output voltage level;
- wherein a preconfigured number (N) of said strings of serial-units are electrically connected in parallel, forming rows of row solar cells of the multiplicity of solar cells, to form an array of said columnar solar cells and row solar cells in said crisscross, N by M matrix configuration, and wherein said array of said columnar solar cells and row solar cells is facilitated to produce a first output power level;
- wherein each of the multiplicity of solar cells is capable of providing a respective maximum output power value;
- wherein said columnar solar cells and row solar cells are pre-sorted according to a class of tolerance of output power value that each of the columnar solar cells and row solar cells is capable of providing;
- wherein for each of the columns of columnar solar cells, said columnar solar cells are arranged in an order such that each column has columnar solar cells of a class of tolerance of output power that is greater than or equal to all of the column solar cells in a previous column of columnar solar cells;
- wherein at least one column has mixture of columnar solar cells having the same class of tolerance and a class of tolerance greater than a previous class of tolerance; and
- at least one high efficiency DC/DC power transformer or at least one high efficiency DC/DC converter electricity connected to said crisscross, N by M matrix configuration, said DC/DC power transformer or DC/DC converter configured to boost said first output voltage level to a second output voltage level, higher than said first output voltage level, wherein said first output voltage level is insufficient to meet the desired application operating voltage level requirement.

2. The solar power generation system of claim 1, wherein said columnar solar cells and said row solar cells, in each of said strings of serial-units, are capable of providing the same maximum output power value.

3. The solar power generation system of claim 1, wherein columnar solar cells in a last column of solar cells are solar cells having the highest maximum output power values.

4. The solar power generation system of claim 1, wherein said first output power level is equal or higher than an operating power that is sufficient to meet the desired application operating voltage level requirement.

5. The solar power generation system of claim 1, wherein at least one column has columnar solar cells of a class of tolerance that is solely greater than a class of tolerance of all previous columns of columnar solar cells.

6. A solar power generation system for generating electrical power for a desired application operating voltage level requirement, the system comprising at least one solar-array module, wherein said at least one solar-array module comprises:
- a multiplicity of solar cells, physically arranged in a crisscross, N by M matrix configuration,
- wherein a preconfigured number (M) of said multiplicity of solar cells are electrically connected in series to form strings of serial-units, being columns of columnar solar cells, said string of serial-units is facilitated to produce a first output voltage level;
- wherein a preconfigured number (N) of said strings of serial-units are electrically connected in parallel, forming rows of row solar cells of the multiplicity of solar cells, to form an array of said columnar solar cells and row solar cells in said crisscross, N by M matrix configuration, and wherein said array of said columnar solar cells and row solar cells is facilitated to produce a first output power level;
- wherein each of the multiplicity of solar cells is capable of providing a respective maximum output power value;
- wherein said columnar solar cells and row solar cells are pre-sorted according to a class of tolerance of output power value that each of the columnar solar cells and row solar cells is capable of providing;
- wherein for each of the columns of columnar solar cells, said columnar solar cells are arranged in an order such that each column has columnar solar cells of a class of tolerance of output power that is less than or equal to all of the columnar solar cells in a previous column of columnar solar cells;
    - wherein at least one column has mixture of columnar solar cells having the same class of tolerance and a class of tolerance less than a previous class of tolerance; and
- at least one high efficiency DC/DC power transformer or at least one high efficiency DC/DC converter electricity connected to said crisscross, N by M matrix configuration, said DC/DC power transformer or DC/DC converter configured to boost said first output voltage level to a second output voltage level, higher than said first output voltage level, wherein said first output voltage level is insufficient to meet the desired application operating voltage level requirement.

7. The solar power generation system of claim 6, wherein at least one column has columnar solar cells of a class of tolerance that is solely less than a class of tolerance of all previous columns of columnar solar cells.

8. The solar power generation system of claim 7, wherein said columnar solar cells and said row solar cells, in each of said strings of serial-units, are capable of providing the same maximum output power value.

9. The solar power generation system of claim 7, wherein columnar solar cells in a last column of solar cells are solar cells having the least maximum output power values.

10. The solar power generation system of claim 7, wherein said first output power level is equal or higher than an operating power that is sufficient to meet the desired application operating voltage level requirement.

* * * * *